United States Patent [19]
Ryat

[11] Patent Number: 5,323,120
[45] Date of Patent: Jun. 21, 1994

[54] HIGH SWING OPERATIONAL TRANSCONDUCTANCE AMPLIFIER

[75] Inventor: Marc H. Ryat, Santa Clara, Calif.

[73] Assignee: SGS-Thomson Microelectronics, Inc., Carrollton, Tex.

[21] Appl. No.: 472

[22] Filed: Jan. 5, 1993

[51] Int. Cl.[5] .............................................. H03F 3/45
[52] U.S. Cl. ................................... 330/252; 330/261
[58] Field of Search ............... 330/252, 253, 257, 258, 330/261

[56] References Cited

U.S. PATENT DOCUMENTS 5,214,329  5/1993  Furino ............................ 330/261 X Primary Examiner—Steven Mottola
Attorney, Agent, or Firm—Kenneth C. Hill; Lisa K. Jorgenson; Richard K. Robinson

[57] ABSTRACT

A differential input stage for an operational transconductance amplifier is provided with complementary input transistor pairs. For each pair, a diode dummy load is provided. When the common mode input signal is near the positive or negative supply voltage, one of the pairs turns off. The diode loads act to increase the current through the other pair when this occurs. This results in the provision of a constant transconductance over the entire common mode input range.

13 Claims, 3 Drawing Sheets

HIGH SWING OPERATIONAL TRANSCONDUCTANCE AMPLIFIER

BACKGROUND OF THE INVENTION

1. Field of the Invention

The present invention relates generally to electronic amplifiers, and more specifically to an operational transconductance amplifier.

2. Description of the Prior Art

An operational transconductance amplifier (OTA) is similar to the well known operational amplifier. It differs in that it consists of only one stage, and is exclusively intended for use with capacitive loads.

One design for an OTA includes a differential input stage, and four current mirrors. An example of such a circuit is shown in FIG. 1. In order to obtain a common mode input range which extends from the negative to the positive supply voltages, complementary pairs of input transistors must be used in the differential input stage. When the common mode is in the mid-range, both transistors of each pair are on. Near the positive or negative supply, only one transistor pair is on.

This means that the transconductance of the input stage, and therefore the overall amplifier, is not constant over the full common mode input voltage range. A differing transconductance over this range causes a different gain-bandwidth product over the input range. Additionally, the slew rate of the overall amplifier changes with such changing transconductance. These effects negatively impact the low supply performance of the device.

It would therefore be desirable to provide an input stage for an amplifier which has a constant transconductance over the full common mode voltage range.

SUMMARY OF THE INVENTION

Therefore, in accordance with the present invention, a differential input stage for an operational transconductance amplifier is provided with complementary input transistor pairs. For each pair, a diode dummy load is provided. When the common mode input signal is near the positive or negative supply voltage, one of the pairs turns off. The diode loads act to increase the current through the other pair when this occurs. This results in the provision of a constant transconductance over the entire common mode input range.

BRIEF DESCRIPTION OF THE DRAWINGS

The believed novel features of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
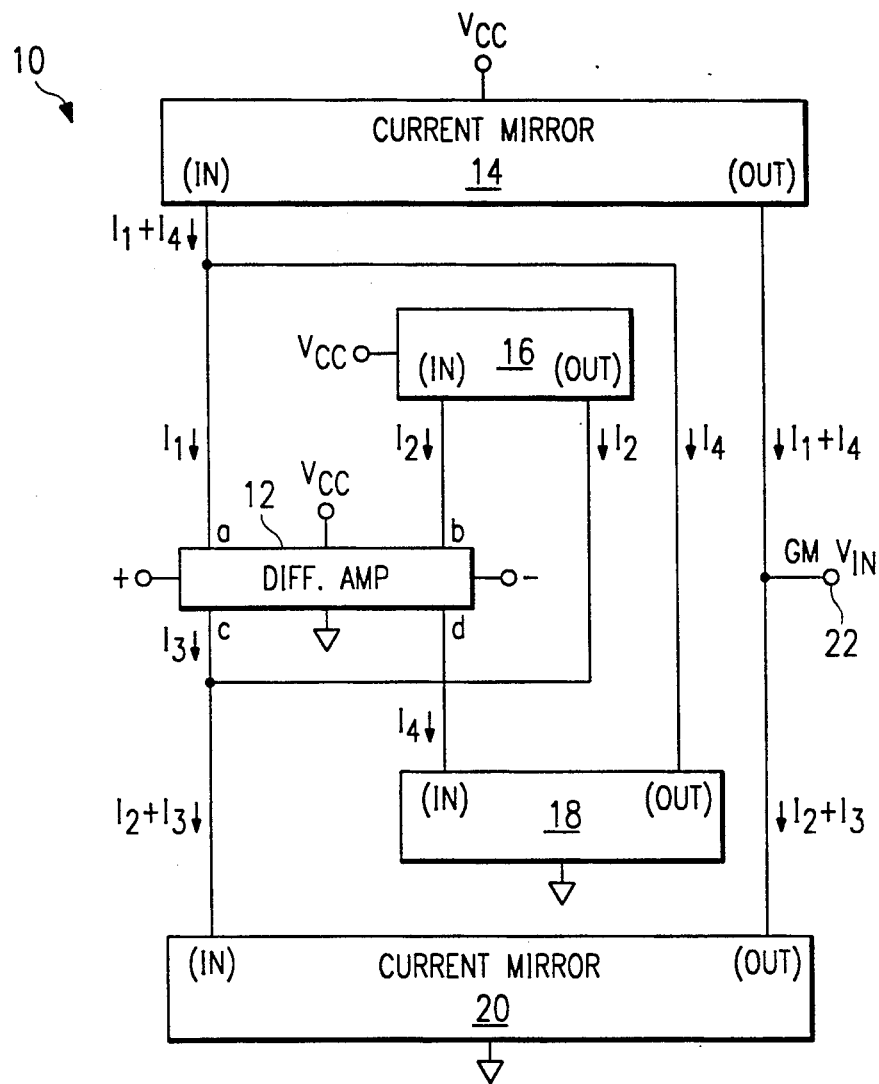
FIG. 1 is a schematic block diagram of an operational transconductance amplifier such as used in the prior art.

Referring to FIG. 1, a block diagram of an operational transconductance amplifier (OTA) generally is referred to with reference number 10. The overall amplifier is of a design known in the prior. The amplifier 10 contains a differential input stage 12 having positive (+) and (−) inputs. The input stage 12 also contains four terminals a, b, c, and d. Current $I_1$ is the current from terminal a, and current $I_2$ is the current from terminal b. Currents $I_3$ and $I_4$ are the currents out of terminals c and d, respectively.

The overall amplifier 10 also contains four current mirrors, 14, 16, 18, 20. These current mirrors can be of any suitable design as known in the art. The terminals labeled IN and OUT on each current mirror indicate the function of each mirror. In each case, the current at the OUT terminal is forced to be the same as that through the IN terminal as is known in the prior art.

As can be seen, the current $I_1+I_4$ is drawn into the input terminal of current mirror 14, so the same current is output therefrom. Current mirror 20 has current $I_2+I_3$ on the input terminal so that the same current is generated on the output terminal. The difference in the two values is the output from the amplifier at node 22. The remaining currents are as shown in FIG. 1.

In order to improve the common-mode input range of the amplifier 10, it is desirable to make the transconductance of the input stage 12 as constant as possible. Four alternative circuits for doing this are shown in the following figures.

Figure 2:
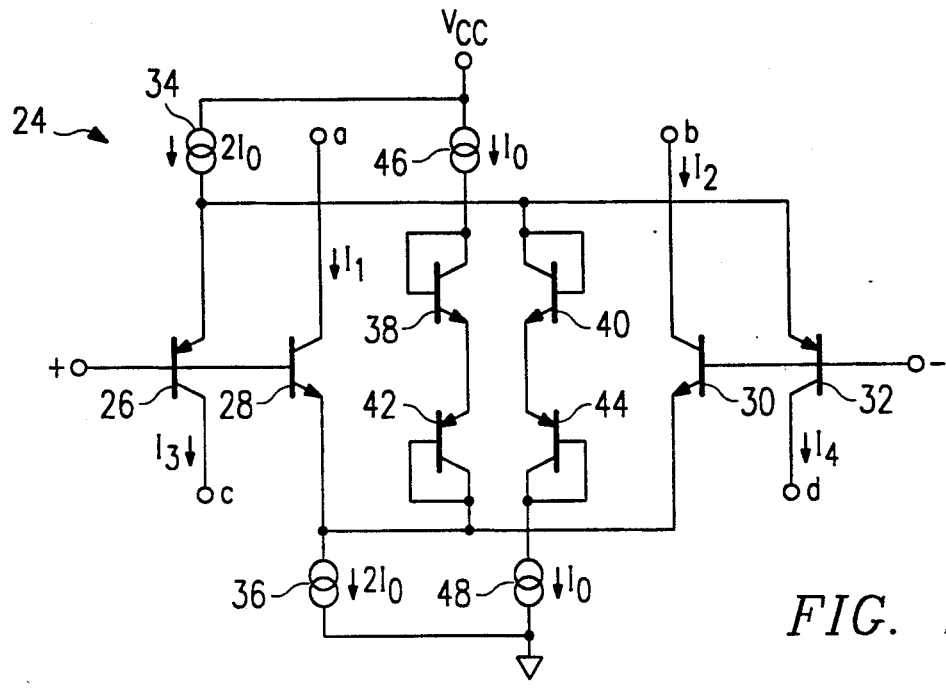
FIG. 2 is a schematic diagram of an input differential stage using bipolar transistors according to the present invention.

Referring to FIG. 2, an input stage 24 has positive and negative input terminals. Transistors 26 and 28 are connected to the positive input terminal, and transistors 30 and 32 are connected to the negative input terminal. The emitter of transistor 26 is connected to the positive supply voltage Vcc through current source 34. The emitter of transistor 28 is connected to the negative supply terminal, here indicated as ground, through current source 36. The emitter of transistor 30 is connected to the emitter of transistor 28, and the emitter of transistor 32 is connected to the emitter of transistor 26. Transistors 26 and 32 form one transistor pair, and transistors 28 and 30 form a complementary pair. The collectors of the four transistors 26–32 are connected to the input terminals a, b, c, and d, as shown.

In addition to the input transistors, several transistors are connected as diodes as shown. Transistors 38 and 40 are NPN transistors, while transistors 42 and 44 and PNP transistors.

Current source 46 is connected to the diode stack 38, 42. Current source 48 is connected to the diode stack 40, 44. Diode stack 38, 42 is also connected to the emitter of transistor 28. Diode stack 40, 44 is also connected to the emitter of transistor 34.

Current sources 46, 48 each supply a current having a value of $I_0$. Each of the current sources 34, 36 supplies a current having a value $2I_0$. Operation of the input stage 24 will now be explained.

When the common mode input voltage is in the mid-range, all four transistors 26, 28, 30, and 32 are on. Because current source 34 must supply a current having a value $I_0$ through diode string 40, 44, $I_0$ also flows through the pair of transistors 26 and 32. In a similar manner, the current $I_0$ drawn by the diode string 38, 42 causes the total current through transistor pair 28, 30 to be $I_0$.

The total transconductance of the input stage with a mid-range common mode input is $$GM = \frac{I_0}{V_c} + \frac{I_0}{V_t} = \frac{2I_0}{V_t} \tag{1}$$

When the common mode is very near the negative supply voltage, the transistor pair 28, 30 is off. This occurs because the bias current source saturates. Diode string 40, 44 is also off because its current source saturates. The transconductance of the input stage is now given by the remaining PNP pair of transistors 26, 32. These transistors are now biased with a full $2I_0$, because the current $I_0$ that was originally subtracted from it through diode string 40, 44 has been cut off. The total transconductance of the input stage 24 is now $$GM = 0 + \frac{2I_0}{V_t} = \frac{2I_0}{V_t} \tag{2}$$

The current $I_0$ flowing through diode string 38, 42 still subtracts from the current $2I_0$ that previously biased the NPN pair 28, 30. This pair is therefore cutoff, but none of the devices in the circuit are reverse biased.

When the common mode input voltage is close to the positive supply, a symmetrical behavior occurs. In this instance, transistors 26, 32 are turned off, with a current having the value $2I_0$ being used to bias transistors 28, 30. Thus, the overall transconductance of the circuit, at any common mode input, remains constant at the value $2I_0/V_t$.

Figure 3:
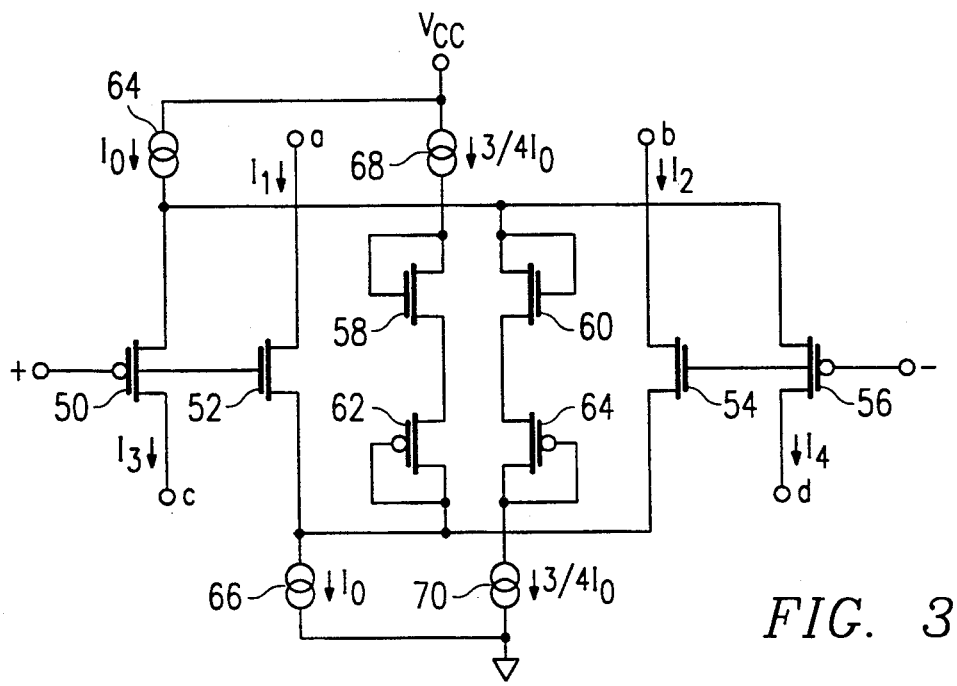
FIG. 3 is a schematic diagram of a differential input stage using field effect transistors in accordance with the present invention.

FIG. 3 is a schematic diagram of the circuit of FIG. 2, with the exception that it is implemented in CMOS technology. Operation of this circuit is analogous to that shown in FIG. 2. Input transistors 50, 52, 54, 56 form complementary input pairs as before. Transistors 58, 60, 62, 64, form diode strings analogous to those of FIG. 2. Transistors 50, 56, 62, 64 are P-channel devices, while transistors 52, 54, 58, and 60 are N-channel devices. The transistor bulk connections must be isolated and made to the sources of each device.

Current sources 64, 66, 68 and 70 are connected to the circuit as shown. They perform substantially the same function as do the current sources described in connection with FIG. 2. The current ratios between the current sources 64-70 differ from those in the bipolar case, because the transconductance of a field effect transistor is proportional to the square root of the bias current, rather than being directly proportional to the bias current as is the case in bipolar technology. The transconductance of one transistor is $$Gm = \sqrt{\frac{2\beta I}{n}} \tag{3}$$

where $\beta$ is a constant depending on transistor size, and $n$ is another technology dependent, but size independent, factor. Because of this difference in proportion, the current sources in the CMOS implementation must have different ratios.

The transconductance of the overall amplifier is composed of two terms. The first is due to the NMOS pair transconductance with the second due to the PMOS pair transconductance. The overall transconductance of the amplifier is given by $$\begin{aligned} GM &= GMN + GMP \\ &= \sqrt{\frac{2\beta_N I_N}{n}} + \sqrt{\frac{2\beta_P I_P}{n}} \end{aligned} \tag{4}$$

If the ratio between current sources is taken to be $\frac{3}{4}$ as show in FIG. 3, the transconductance across the range of common mode input voltages will be the same. For the mid-range case, where all transistors are active, $$\begin{aligned} GM &= \sqrt{\frac{2\beta_N\left(1-\frac{3}{4}\right)I_0}{n}} + \sqrt{\frac{2\beta_P\left(1-\frac{3}{4}\right)I_0}{n}} \\ &= \sqrt{\frac{2\beta_N I_0}{4n}} + \sqrt{\frac{2\beta_P I_0}{4n}} \end{aligned} \tag{5}$$

If the NMOS and PMOS pairs have geometry such that $$\beta_N = \beta_P = \beta$$

then $$GM = 2\sqrt{\frac{2\beta I_0}{4n}} = \sqrt{\frac{8\beta I_0}{4n}} = \sqrt{\frac{2\beta I_0}{n}} \tag{7}$$

At the lower range of input voltage, the N-channel pair of transistors is off. Therefore the transconductance is uniquely provided by the P-channel devices.

$$GM = GMP = \sqrt{\frac{2\beta(I_0 - 0)}{n}} = \sqrt{\frac{2\beta I_0}{n}} \tag{8}$$

When the common mode input is very near the positive supply source, the P-channel pair of devices is off. In this case $$GM = GMN = \sqrt{\frac{2\beta(I_0 - 0)}{n}} = \sqrt{\frac{2\beta I_0}{n}} \tag{9}$$

Thus, regardless of the common mode input value, the transconductance of the differential input stage remains constant.

Figure 4:
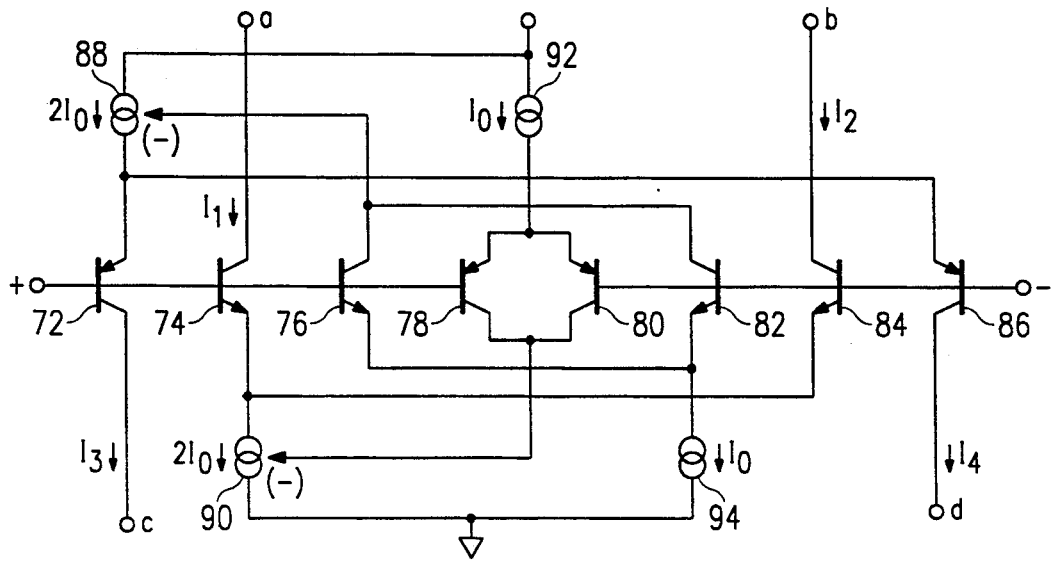
FIG. 4 is a schematic diagram of a bipolar input stage which is an alternative to that shown in FIG. 2.

Referring to FIG. 4, an alternative bipolar implementation is shown. This circuit operates in a manner analogous to the circuit of FIG. 2, except that the diode stacks of FIG. 2 are now connected as active transistors. The bases of transistors 72, 74, 76 and 78 are connected to the positive input, and the bases of transistors 80, 82, 84, and 86 are connected to the negative input. Current source 88 supplies input transistor 72 and 86, and current source 90 biases transistors 74 and 84. Current source 92 biases transistors 78 and 80, while current source 94 biases transistor 76 and 82.

With this circuit, the collectors of transistors 78 and 80 are connected directly into the current source 90. The collectors of transistors 76 and 82 are connected directly into the current source 88. Current sources 88 and 90 are designed so that the subtraction of the currents through the dummy transistors 76-82 occurs directly within the current sources 88, 90, rather than at a node connected to the emitter of one of the input transistors as was the case in FIG. 2. This approach may be useful when all bias current sources have been cascoded, in which case the current subtraction occurs on the cascoding devices of the bias sources.

Figure 5:
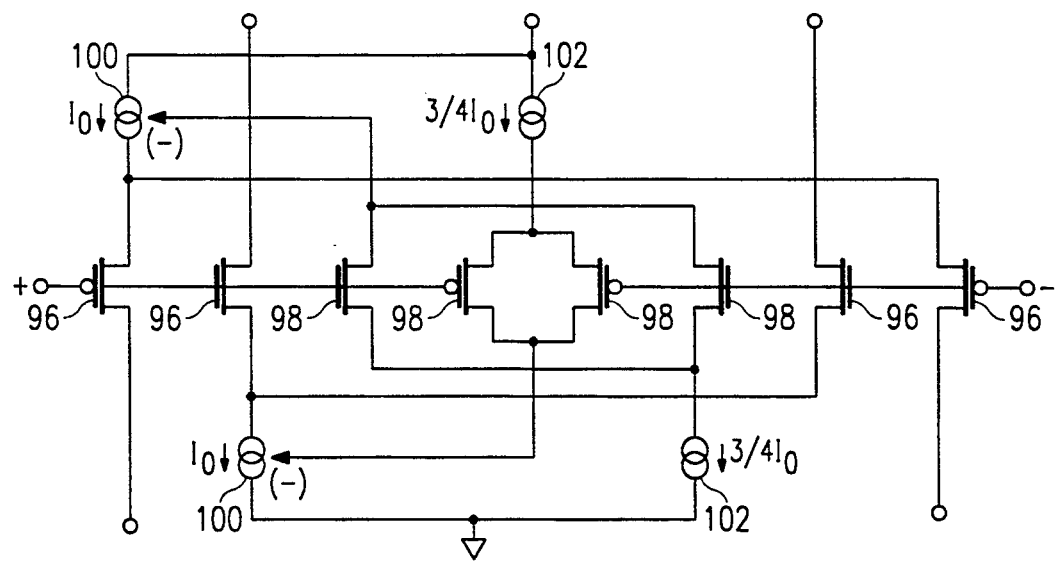
FIG. 5 is a schematic diagram of a preferred input stage using field effect transistors which is an alternative to that shown in FIG. 3.

FIG. 5 is a CMOS implementation of the circuit of FIG. 4. Transistors 96 act as the input transistors, with transistors 98 acting as the dummy load transistors as before. Current sources 100 each provide a current of $I_0$ and current sources 102 provide a current of $\frac{3}{4} I_0$. The equations for finding the overall transconductance of the circuit of FIG. 5 at different common mode input voltages are the same equations 3-9 above discussed in connection with FIG. 3. With this implementation, the transistor bulks can be connected to Vdd and the substrate.

The circuits of the various embodiments all provide the following advantages over prior art input stages. The total transconductance of the differential input stage, and therefore the overall amplifier, remains constant over the entire common mode input range. The circuits are easily adapted to either bipolar or CMOS implementation. When the input bias voltage changes, no reverse-biasing of any component occurs. All components are always far from being reverse-biased, and are either conductive or off. This is important especially in the bipolar implementations, wherein reverse-biasing of base-emitter junctions is destructive and must be avoided.

With the implementations of FIGS. 4 and 5, subtraction of the currents through the dummy transistors occurs within the bias current sources rather than on the emitters of the input transistors. However, the input base current and input capacitance are increased in this case, because the bases of four transistors are connected together at each input terminal rather than only two. With the circuits of FIGS. 2 and 3, no such increase of input capacitance or input bias current occurs.

While the invention has been particularly shown and described with reference to a preferred embodiment, it will be understood by those skilled in the art that various changes in form and detail may be made therein without departing from the spirit and scope of the invention.

What is claimed is:

1. A differential amplifier, comprising:
   a voltage supply having first and second supply terminals;
   a first pair of input transistors;
   a second pair of input transistors complementary with the first pair;
   first and second current sources for biasing the first and second pair of input transistors, respectively;
   first and second load circuits for decreasing, respectively, the bias current supplied by the first and second current sources;
   wherein the first input pair turns off when a common mode input voltage becomes close to a voltage on the first supply terminal, and the second input pair turns off when a common mode input voltage becomes close to a voltage on the second supply terminal; and
   wherein the second load circuit ceases to decrease the bias current supplied by the first source when the common mode input voltage becomes close to the voltage on the first supply terminal, and wherein the first load circuit ceases to decrease the bias current supplied by the second source when the common mode input voltage becomes close to the voltage on the second supply terminal, whereby the transconductance of the differential amplifier remains relatively constant.

2. The differential amplifier of claim 1, wherein the first and second load circuits comprise diodes in series with, respectively, the first and second current sources.

3. The differential amplifier of claim 2, wherein the first and second load circuits further each comprise a current source in series with the diodes for controlling the amount of current by which the first and second sources are decreased.

4. The differential amplifier of claim 3, wherein the first load circuit is connected to a common node between the first current source and each of the transistors in the first pair, and wherein the second load circuit is connected to a common node between the second current source and each of the transistors in the second pair.

5. The differential amplifier of claim 1, wherein the first and second load circuits each comprise two transistors and a current source in series with them for controlling the amount of current by which the first and second sources are decreased.

6. The differential amplifier of claim 5, wherein the two transistors in each load circuit are diode connected and in series.

7. The differential amplifier of claim 5, wherein the two transistors in each load are connected in parallel with each other.

8. The differential amplifier of claim 7, wherein the transistors of the first and second load circuits are bipolar transistors, and wherein the input terminals of the two transistors in each load are connected to the bases of the input transistors in the pair.

9. The differential amplifier of claim 8, wherein the two transistors in the first and second load have a common terminal connected directly to the first and second current sources, respectively, wherein current is withdrawn directly from the current sources without a direct connection being made to a terminal of an input transistor.

10. The differential amplifier of claim 5, wherein all of the transistors comprise bipolar transistors.

11. The differential amplifier of claim 10, wherein the current sources in the load circuits supply a current having a value one-half as large as that provided by the first and second current sources.

12. The differential amplifier of claim 5, wherein all of the transistors comprise field effect transistors.

13. The differential amplifier of claim 12, wherein the current sources in the load circuits supply a current having a value three-fourths as large as that provided by the first and second current sources.

* * * * *